United States Patent [19]

Tokoh et al.

[11] Patent Number: 5,238,784
[45] Date of Patent: Aug. 24, 1993

[54] PHOTOSENSITIVE RESIN COMPOSITION WITH POLYAMIC ACID POLYMER

[75] Inventors: Akira Tokoh, Tokyo; Nobuyuki Sashida, Yokohama; Etsu Takeuchi, Yokohama; Takashi Hirano, Yokohama, all of Japan

[73] Assignee: Sumitomo Bakelite Company Limited, Tokyo, Japan

[21] Appl. No.: 618,794

[22] Filed: Nov. 28, 1990

[30] Foreign Application Priority Data

| Nov. 30, 1989 | [JP] | Japan | 1-309310 |
| Apr. 5, 1990 | [JP] | Japan | 2-089167 |
| Apr. 11, 1990 | [JP] | Japan | 2-093943 |
| Apr. 17, 1990 | [JP] | Japan | 2-099304 |
| May 2, 1990 | [JP] | Japan | 2-115058 |
| Jul. 6, 1990 | [JP] | Japan | 2-177375 |
| Jul. 20, 1990 | [JP] | Japan | 2-190609 |

[51] Int. Cl.$^5$ .................. G03F 7/028; G03F 7/027
[52] U.S. Cl. ................... 430/283; 430/191; 430/192; 430/196; 430/197; 430/906; 522/137; 522/139; 522/140; 522/136
[58] Field of Search ............ 430/283, 191, 192, 196, 430/197, 906; 522/96, 137, 139, 140, 136

[56] References Cited

U.S. PATENT DOCUMENTS

| 4,451,551 | 5/1984 | Kataoka et al. | 430/197 X |
| 4,547,455 | 10/1985 | Hiramoto et al. | 430/197 X |
| 4,587,197 | 5/1986 | Kojima et al. | 430/196 |
| 4,608,333 | 8/1986 | Ohbayashi et al. | 430/197 X |

FOREIGN PATENT DOCUMENTS 0337698 10/1989 European Pat. Off. .
2914619 10/1979 Fed. Rep. of Germany .

OTHER PUBLICATIONS

Patent Abstracts of Japan, vol. 12, No. 159 (C-495)(3006) 14 May 1988, & JP-A-62 273260 (Asahi Chem Ind.) 27 Nov. 1987.

Primary Examiner—Cynthia Hamilton
Attorney, Agent, or Firm—Browdy and Neimark

[57] ABSTRACT

The present invention provides a photosensitive resin composition which comprises, as essential components:
(A) a polyamic acid having a recurring unit represented by the following formula [I]:

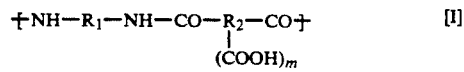

wherein $R_1$ and $R_2$ each represents an organic group selected from the group consisting of an aromatic group, an alicyclic group, an aliphatic group, and a heterocyclic group and m is 1 or 2,
(B) an amide compound having carbon-carbon double bond, and
(C) a photosensitizer.

17 Claims, No Drawings

PHOTOSENSITIVE RESIN COMPOSITION WITH POLYAMIC ACID POLYMER

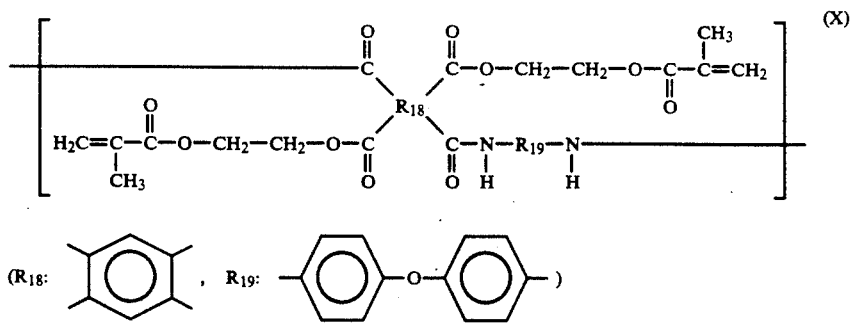

The present invention relates to a photo-sensitive resin composition of high sensitivity and a process for producing it.

Hitherto, polyimide resins having superior heat resistance and excellent electrical properties and mechanical properties have been used for surface protective film and interlayer dielectrics of a semiconductor device. Recently, much improvement of thermal cycle resistance and thermal shock resistance has been demanded for high integration and enlargement of semiconductor devices, thinning and miniaturization of sealing resin package and shifting to surface packaging method by solder reflow, and polyimide resins of higher performances have been desired.

On the other hand, recently attention has been paid to technique for imparting photosensitivity to polyimide resins per se.

Use of such polyimide resins provided with photosensitivity not only results in an effect to simplify the step of pattern formation as compared with in the case of using polyimide resins provided with no photosensitivity, but also are preferred in safety and for prevention of environmental pollution because etching solution of high toxicity is not necessary. Thus, it is expected that photosensitization of polyimide resins becomes an important technique.

As photosensitive polyimide resins, there have been known, for example, a composition comprising a polyimide precursor to which photosensitivity is imparted with ester group and which has the structure represented by the following formula (X) (e.g., Japanese Patent Post-Exam. Publn. No. 55-41422):

and a composition which comprises a polyamic acid having the structure represented by the following formula (Y) to which is added a compound containing carbon-carbon double bond and amino group or its quaternary salt which are dimerizable or polymerizable by actinic radiation (e.g., Japanese Patent Post-Exam. Publn. No. 59-52822):

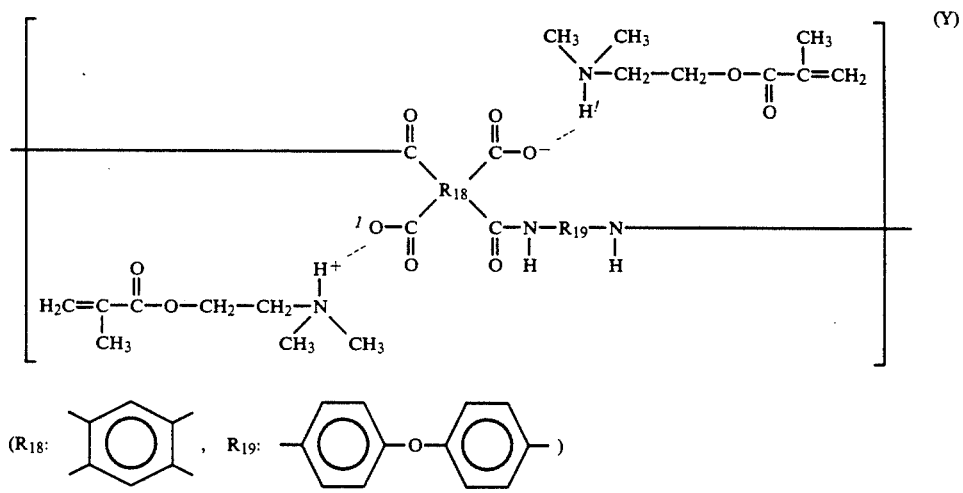

These compositions are dissolved in a suitable solvent, coated in the state of varnish and dried, and thereafter the coat is irradiated with ultraviolet ray through a photomask, and then subjected to development and rinsing treatments to obtain a desired pattern, which is further subjected to heating treatment to form a polyimide film.

However, these conventional compositions have the following defects. That is, the composition comprising a polyimide precursor shown by (X) is produced through very complicated steps of first subjecting a tetracarboxylic acid dianhydride and an alcohol having photosensitive group to esterification reaction and then subjecting the ester to amidation reaction with a diamine, and so stabilization of products is difficult. However, since ester bond is strong, the composition has the advantage that spray development (rapid and short-time development by vigorous spraying of developing solution) can be carried out. On the other hand, since the bonding is too strong, photosensitive group cannot be completely removed even at high temperature of higher than 400°

C. and the resulting polyimide film blackens and film properties (strength, elongation, etc.) deteriorate. The composition comprising a polyamic acid shown by (Y) can be produced only by mixing a polyamic acid with a photosensitive agent, and hence production steps are very simple, but ionic bonding between the polyamic acid and the photosensitive agent is very weak and so paddle development (development by dropping developing solution on a stationary film to be developed) must be employed and besides, processing lattitude at development is narrow. Moreover, change in viscosity of the varnish at room temperature is great and it lacks storage stability and thus it is insufficient for application to step of production of a semiconductor. On the other hand, the composition has the advantages that owing to weak bonding power, photosensitive group can be easily removed by heating and properties of the resulting polyimide film are superior. However, both the compositions characterized by (X) and (Y) have an exposure sensitivity of 500–1000 mJ/cm$^2$, which is not sufficient to attain the enhancement of sensitivity demanded with recent progress of technique.

The objects of the present invention are:

(1) to provide a photosensitive resin composition of markedly high sensitivity and resolution, (2) to provide a photosensitive resin composition with no variability in quality by very simple method, and (3) to provide a photosensitive resin composition superior in film properties after cured.

The present invention relates to a photosensitive resin composition which comprises, as essential components, (A) a polyamic acid having recurring unit represented by the following formula [I]:

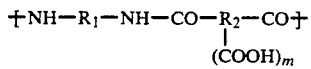

$$\mathrm{+NH-R_1-NH-CO-R_2-CO+} \quad \text{[I]}$$
$$\hspace{3em} | $$
$$\hspace{3em} (\mathrm{COOH})_m$$

wherein $R_1$ and $R_2$ each represents an organic group selected from the group consisting of an aromatic group, an alicyclic group, an aliphatic group and a heterocyclic group and m is 1 or 2, (B) an amide compound having carbon-carbon double bond, and (C) a photosensitizer.

Proportions of polyamic acid (A), amide compound (B) and photosensitizer (C) are 10–500 parts by weight, preferably 50–200 parts by weight of amide compound (B) and 0.1–50 parts by weight, preferably 1–10 parts by weight of photosensitizer (C) per 100 parts by weight of polyamic acid (A).

As mentioned hereinafter, when amide compound (B) which is liquid at room temperature is used both as a photosensitive agent and as a solvent, the above-mentioned amount of amide compound (B) means an amount thereof present substantially as a photosensitive agent after the compound (B) in an amount corresponding to that of the solvent has been vaporized.

Polyamic acid (A) in the present invention preferably becomes an aromatic polyimide after heat curing for improvement of heat resistance of polyimide film. Such polyamic acid (A) is usually obtained by reaction of an aromatic diamine with an aromatic tetracarboxylic acid dianhydride.

Nonlimiting examples of aromatic diamines, alicyclic diamines, aliphatic diamines or heterocyclic diamines corresponding to $H_2N-R_1-NH_2$ which are used for preparation of the polyamic acid are the following diamines: m-phenylenediamine, 1-isopropyl-2,4-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 3,3'-diaminobiphenyl, 3,3'-dimethyl-4,4'-diaminobiphenyl, 3,3'-dimethoxybenzidine, 4,4''-diamino-p-terphenyl, 3,3''-diamino-p-terphenyl, bis(p-aminocyclohexyl)methane, bis(p-β-amino-t-butylphenyl) ether, bis(p-8-methyl-δ-aminopentyl)benzene, p-bis(2-methyl-4-aminopentyl)benzene, p-bis(1,1-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine, p-xylylenediamine, 2,6-diaminopyridine, 2,5-diaminopyridine, 2,5-diamino-1,3,4-oxadiazole, 1,4-diaminocyclohexane, piperazine, methylenediamine, ethylenediamine, propylenediamine, 2,2-dimethylpropylenediamine, tetramethylenediamine, pentamethylenediamine, hexamethylenediamine, 2,5-dimethylhexamethylenediamine, 3-methoxyhexamethylenediamine, heptamethylenediamine., 2,5-dimethylheptamethylenediamine, 3-methylheptamethylenediamine, 4,4-dimethylheptamethylenediamine, octamethylenediamine, nonamethylenediamine, 5-methylnonamethylenediamine, 2,5-dimethylnonamethylenediamine, decamethylenediamine, 1,10-diamino-1,10-dimethyldecane, 2,11-diaminododecane, 1,12-diaminooctadecane, 2,12-diaminooctadecane, 2,17-diaminoeicosane, 2,6-diamino-4-carboxylic benzene, and 3,3'-diamino-4,4'-dicarboxylic benzidine.

As the diamine component used in the present invention, in order to give special properties it is, of course, also possible to use silicone diamines or aliphatic diamines in combination with the aromatic or alicyclic or heterocyclic diamines as a main component.

Aromatic or alicyclic or heterocyclic tetracarboxylic acid dianhydrides corresponding to $O(CO)_2R_2(CO)_2O$ which are used preferably for preparation of the polyamic acid, may be used alone or in admixture of two or more. Nonlimiting examples of the aromatic or alicyclic or heterocyclic tetracarboxylic acid dianhydrides are as follows: pyromellitic acid dianhydride, benzene-1,2,3,4-tetracarboxylic acid dianhydride, 3,3',4,4'-benzophenonetetracarboxylic acid dianhydride, 2,2',3,3'-benzophenonetetracarboxylic acid dianhydride, 2,3,3',4'-benzophenonetetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,4,5,8-tetracarboxylic acid dianhydride, naphthalene-1,2,6,7-tetracarboxylic acid dianhydride, 4,8-dimethyl-1,2,3,5,6,7-hexahydronaphthalene-1,2,5,6-tetracarboxylic acid dianhydride, 4,8-dimethyl-1,2,3,5,6,7-hexahydronaphthalene -2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-diphenyltetracarboxylic acid dianhydride, 2,2',3,3'-diphenyltetracarboxylic acid dianhydride, 2,3,3',4'-diphenyltetracarboxylic acid dianhydride, 3,3'',4,4'''-p-terphenyltetracarboxylic acid dianhydride, 2,2'',3,3'''-p-terphenyltetracarboxylic acid dianhydride, 2,3'',4'''-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7-tetracarboxylic acid dianhydride, phenanthrene-1,2,9,10-tetracarboxylic acid dianhydride, cyclopentane-1,2,3,4-tetracarboxylic acid dianhydride, pyrazine-2,3,5,6-tetracarboxylic acid dianhydride, pyrrolidine-2,3,4,5-tetracarboxylic acid dianhydride, and thiophene-2,3,4,5-tetracarboxylic acid dianhydride.

It is a matter of course that in addition to the above aromatic or alicyclic or heterocyclic tetracarboxylic acid dianhydride, silicone tetracarboxylic acid dianhydride or aliphatic tetracarboxylic acid dianhydride can be used in combination with the above dianhydride for imparting various characteristics.

There may be used trimellitic acid anhydride and the like as an aromatic tricarboxylic acid anhydride corresponding to $O(CO)_2R_2COOH$ which can be used for preparation of the polyamic acid.

The polyamic acid used in the present invention can be obtained usually by reacting a tetracarboxylic acid dianhydride with a diamine in a reaction solvent as shown below. The reaction solvent is a known organic polar solvent having a dipole moment and having a functional group which does not react with acid anhydrides and diamines.

The organic polar solvent must be inert to the reaction system and be a solvent for the product and besides, it must be a solvent for at least one, preferably both of the reaction components.

Typical examples of the solvent are N,N-dimethylformamide, N,N-dimethylacetamide, N,N-diethylformamide, N,N-diethylacetamide, N,N-dimethylmethoxyacetamide, dimethyl sulfoxide, hexamethylphosphamide, N-methyl-2-pyrrolidone, pyridine, dimethyl sulfone, tetramethylene sulfone, dimethyl-tetramethylene sulfone, methylformamide, N-acetyl-2-pyrrolidone, diethylene glycol monomethyl ether, and diethylene glycol dimethyl ether. These solvents may be used alone or in combination of two or more. Non-solvents such as benzene, benzonitrile, dioxane, butyrolactone, methyl cellosolve, ethyl cellosolve, butyl cellosolve, xylene, toluene, and cyclohexane may be used in combination with the above solvents.

Polymerization degree of polyamic acid (A) in the present invention is usually 10–10000, more preferably 20–500. If the polymerization degree is too low, mechanical strength and heat resistance of the resulting cured film is inferior. If the polymerization degree is too high, the resulting resin viscosity increases, and not only coating operation is difficult, but also long time is required for development and productivity decreases.

When polyamic acid (A) having actinic ray functional groups P* introduced at the both ends is used, exposure sensitivity can be improved and this is more useful.

P* derived from acrylic or methacrylic group and used in acid anhydride terminated polyamic acid (A) which is represented by the following formula [II] where m in [I] is 2, and both ends of which are substituted with actinic ray functional groups P*, is usually obtained from alcohols having acrylic or methacrylic group.

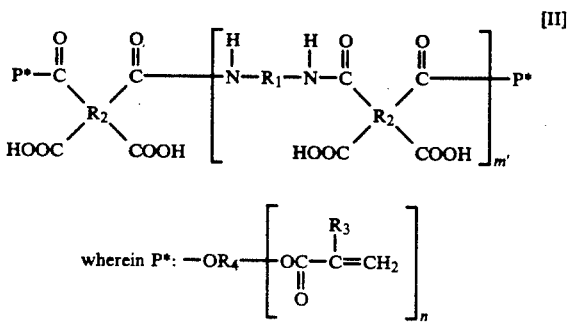

wherein, n=1–5, $R_3$ H, $CH_3$, $R_4$ an organic residue, m'=an integer of 10–10000 and $R_1$ and $R_2$ are as defined above.

Alcohol compounds having acrylic or methacrylic group include, for example, 2-hydroxyethyl methacrylate, 2-hydroxyethyl acrylate, glycerol diacrylate, glycerol dimethacrylate, glycerol acrylate methacrylate, 3-hydroxypropyl methacrylate, 3-hydroxypropyl acrylate, 4-hydroxybutyl acrylate, 4-hydroxybutyl methacrylate, 2-hydroxypropyl acrylate, 2-hydroxypropyl methacrylate, polyethylene glycol-modified acrylate, polypropylene glycol-modified acrylate, polyethylene glycol-modified methacrylate, polypropylene glycol-modified methacrylate, pentaerythritol triacrylate, pentaerylthritol trimethacrylate, pentaerythritol acrylate dimethacrylate, pentaerythritol diacrylate methacrylate, dipentaerythritol pentaacrylate, dipentaerythritol pentamethacrylate, 1,3-diacryloylethyl-5-hydroxyethyl isocyanurate, 1,3-dimethacryloylethyl-5-hydroxyethyl isocyanurate, ethylene glycol-modified pentaerythritol triacrylate, propylene glycol-modified pentaerythritol triacrylate, trimethylolpropane diacrylate, and trimethylolpropane dimethacrylate. The present invention is not limited to use of these alcohol compounds. These may be used alone or in combination of two or more.

One example of process for preparation of polyamic acid (A) represented by the formula [II] is as follows: when a polyamic acid of polymerization degree m' of 1000 is desired, first 1001 moles of an acid anhydride is reacted with 2 moles of an alcohol compound having P* having acrylic or methacrylic group and then, the reaction product is reacted with 1000 moles of a diamine, thereby to obtain the desired polyamic acid.

Since the polyamic acid [II] has P* having acrylic or methacrylic group at both ends, crosslinking density of exposed portion of the coated film increases and on the other hand, unexposed portion has highly-soluble and uncrosslinked functional group P* and thus, difference between solubilities of exposed portion and unexposed portion can be increased, and hence sensitivity can be enhanced. Moreover, since both ends of the polyamic acid are protected with actinic ray responsive group P*, depolymerization of the polyamic acid does not occur and so a resin superior in viscosity stability can be obtained.

Examples of amide compound (B) having carbon-carbon double bond are as follows: acrylamide, methacrylamide, N-methylacrylamide, N-ethylacrylamide, N-methylmethacrylamide, N-ethylmethacrylamide, N,N-dimethylacrylamide, N,N-diethylacrylamide, N,N-dibutylacrylamide, N-acryloylpiperidine, N-acryloylmorpholine, N,N-dimethylmethacrylamide, N,N-diethylmethacrylamide, N,N-dimethylaminoethylmethacrylamide, N,N-dimethylaminopropylmethacrylamide, N-methylolacrylamide, N-methylolmethacrylamide, N-methoxymethylacrylamide, N-methoxymethylmethacrylamide, N-ethoxymethylacrylamide, N-ethoxymethylmethacrylamide, N-isopropoxymethylacrylamide, N-isopropoxymethylmethacrylamide, N-n-butyloxymethylacrylamide, N-n-butyloxymethylmethacrylamide, N-t-butyloxymethylacrylamide, N-t-butyloxymethylmethacrylamide, N,N-dimethylolacrylamide, N,N-dimethylolmethacrylamide, dimethylene ether diacrylamide, dimethylene ether dimethacrylamide, methylenebisacrylamide, methylenebismethacrylamide, diacetoneacrylamide, diacetonemethacrylamide, N-vinylpyrrolidone, and ether type condensates of polyhydric alcohols with N-methylolacrylamide or N-methylolmethacrylamide. These amides may be used alone or in combination of two or more.

It was known, for example, in Japanese Patent Laid-Open No. 62-273260 to add some amount of an amide compound having carbon-carbon double bond of the present invention as an additive to a resin composition which has already photosensitivity. However, a photosensitive resin composition which contains an amide compound per se as a component for imparting photosensitivity has not been known in the field of a photosensitive polyamic acid. Conventional techniques consist mainly of addition or introduction of acrylic acid or methacrylic acid ester to polyamic acid. The present inventors have newly paid attention to an amide compound having carbon-carbon double bond.

This amide compound having carbon-carbon double bond is superior in solubility in polyamic acid, and so the photosensitive agent can be incorporated uniformly and in high concentration and besides, is high in photoreactivity. Therefore, a photosensitive resin composition which is high in sensitivity and which can provide a pattern of high resolution can be easily produced. Furthermore, in the present invention, a photosensitive group is not introduced into polyamic acid through direct covalent bond and therefore, there are obtained simultaneously both of the excellent effects that the amide compound having carbon-carbon double bond is easily scattered away with heat at heat curing and that the resulting cured polyimide film has good properties.

In the case of using acrylic acid esters as in conventional techniques, even the mixture type as disclosed in Japanese Patent Post-Exam. Publn. No. 59-52822 requires heating at 350° C. for 30 minutes, and the reaction type as disclosed in Japanese Patent Post-Exam. Publn. Nos. 55-30207 and 41422 requires heating at 400° C. for 1 hour. Therefore, final cured product considerably blackens and, in the worst case, crumbles and thus strong film cannot be obtained.

In the present invention, use of amide compounds having carbon-carbon double bond which are liquid at room temperature, is more useful, and among the above amide compounds, those which are liquid at 10°-30° C. are, for example, N-methylacrylamide, N-ethylacrylamide, N-methylmethacrylamide, N-ethylmethacrylamide, N,N-dimethylacrylamide, N,N-diethylacrylamide, N,N-dibutylacrylamide, N-acryloylpiperidine, N-acryloylmorpholine, N,N-dimethylmethacrylamide, N,N-diethylmethacrylamide, N-(2-dimethylaminoethyl)-methacrylamide, N-(3-dimethylaminopropyl)methacrylamide, and N-vinylpyrrolidone. The present invention is not limited to use of only these amide compounds.

These amide compounds which are liquid at room temperature, usually show good dissolvability for polyamic acids and diamines and tetracarboxylic acid dianhydrides which are starting materials for the polyamic acids. Therefore, these amide compounds which are liquid at room temperature, can be used for preparation of polyamic acids in place of usual solvents.

Conventional reaction solvents have no responsiveness to light, and so a photosensitive component is especially added in production of photosensitive resins. However, in this case, the photosensitive component is diluted with a large amount of reaction solvent, and thus there is a limit in increasing of concentration of the photosensitive component.

On the other hand, according to the present invention where the above-mentioned amide compounds are used as a solvent, the solvent per se is totally photosensitive and hence, it has become possible to markedly increase concentration of the photosensitive component and thus, photosensitivity of the composition can also be much increased. Furthermore, since process for production of the photosensitive resin according to the present invention comprises merely adding and mixing respective components, the process is very simple and variability of quality is very small.

N-methylol (or N-alkoxymethyl)acryl (or methacryl)amide used in the present invention is a compound which has in one molecule a highly heat-reactive N-methylol or N-alkoxymethyl group and a highly photoreactive acrylamide or methacrylamide group. That is, in N-methylol (or N-alkoxymethyl)acryl or (methacryl)amide, N-methylol or N-alkoxymethyl group first brings about heat-condensation reaction in heat drying step for vaporization of solvent in pattern formation and furthermore, acrylamide or methacrylamide group causes photo-crosslinking reaction in light irradiation step, whereby a photo-pattern of high sensitivity can be formed.

N-methylol (or N-alkoxymethyl)acryl (or methacryl)amide is usually obtained by reaction of acryl or methacrylamide with formalin and alcohol.

Examples of N-methylol (or N-alkoxymethyl)acryl (or methacryl)amides among the above-mentioned amide compounds having carbon-carbon double bond include N-methylolacrylamide, N-methylolmethacrylamide, N-methoxymethylacrylamide, N-methoxymethylmethacrylamide, N-ethoxymethylacrylamide, N-ethoxymethylmethacrylamide, N-isopropoxymethylacrylamide, N-isopropoxymethylmethacrylamide, N-n-butyloxymethylacrylamide, N-n-butyloxymethylmethacrylamide, N-t-butyloxymethylacrylamide, N-t-butyloxymethylmethacrylamide, N,N-dimethylolacrylamide, and N,N-dimethylolmethacrylamide. The present invention is not limited to use of these amide compounds only.

Further, when the above N-methylol (or N-alkoxymethyl)acryl (or methacryl)amide is subjected to heat-reaction in a weak acid having such acidity as of polyamic acids, dimerization with dehydration takes place and dimethylene ether diacrylamide or dimethylene ether dimethacrylamide is obtained. These also have good dissolvability for polyamic acids, and use of them results in photosensitive resin composition of high sensitivity.

In the present invention, it is also possible to use an ether type condensate of them with alcohols as an amide compound.

Ether type condensates of N-methylolacrylamide or N-methylolmethacrylamide with polyhydric alcohols are compounds which have two or more highly photoreactive acrylamide or methacrylamide groups in one molecule. The ether type condensates of N-methylolacrylamide or N-methylolmethacrylamide with polyhydric alcohols not only are high in dissolvability for polyamic acids, but also make it possible to form a photo-pattern of high sensitivity and high resolution as a result of photocrosslinking reaction of acrylamide or methacrylamide group in light irradiation step at formation of photopatterns.

The ether type condensates of N-methylolacrylamide or N-methylolmethacrylamide with polyhydric alcohols can usually be obtained by reaction using an acid such as phosphoric acid as a catalyst.

The polyhydric alcohols include, for example, ethylene glycol, diethylene glycol, tetraethylene glycol, polyethylene glycol, 1,4-butanediol, 1,3-butanediol, glycerine, pentaerythritol, polyvinyl alcohol, triethanolamine, N-methyldiethanolamine, diethanolamine, and N-phenyldiethanolamine. The present invention is not limited to use of these polyhydric alcohols only.

Besides these acrylamides, acrylic acid esters may also be added for imparting various properties.

Among acrylic acid esters, dialkylamino acrylates or methacrylates are superior in dissolvability for polyamic acids and can increase sensitivity of the composition. Examples of dialkylamino acrylates and methacrylates are N,N-dimethylaminoethyl methacrylate, N,N-dimethylaminoethyl acrylate, N,N-diethylaminoethyl methacrylate, N,N-diethylaminoethyl acrylate, N,N-dimethylaminopropyl methacrylate and N,N-dimethylaminopropyl acrylate. The present invention is not limited to use of them.

Addition amount of amino acrylate is 1-100 parts by weight, preferably 5-30 parts by weight per 100 parts by weight of polyamic acid.

The photosensitizer (C) used in the present invention efficiently produces radical or ion upon irradiation with light to accelerate photo-reaction of an amide compound having carbon-carbon double bond.

The photosensitizers used in the present invention include, for example, benzophenone, acetophenone, anthrone, p,p'-tetramethyldiaminobenzophenone (Michler's ketone), phenanthrene, 2-nitrofluorene, 5-nitroacenaphthene, benzoquinone, N-acetyl-p-nitroaniline, p-nitroaniline, 2-ethylanthraquinone, 2-t-butylanthraquinone, N-acetyl-4-nitro-1-naphthylamine, picramide, 1,2-benzanthraquinone, 3-methyl-1,3-diaza-1,9-benzanthrone, p,p'-tetraethyldiaminobenzophenone, 2-chloro-4-nitroaniline, dibenzalacetone, 1,2-naphthoquinone, 2,5-bis(4'-diethylaminobenzal)-cyclopentane, 2,6-bis(4'-diethylaminobenzal)-cyclohexanone, 2,6-bis(4'-dimethylaminobenzal)-4-methylcyclohexanone, 2,6-bis(4'-diethylaminobenzal)-4-methylcyclohexanone, 4,4'-bis(dimethylamino)-chalcone, 4,4'-bis(diethylamino)-chalcone, p-dimethylaminobenzylideneindanone, 1,3-bis(4'-dimethylaminobenzal)-acetone, 1,3-bis(4'-diethylaminobenzal)-acetone, N-phenyldiethanolamine, N-p-tolyldiethylamine, styryl compounds and coumarin compounds and furthermore, 2,2-dimethoxy-2-phenylacetophenone, 1-hydroxycyclohexylphenyl ketone, 2-methyl-[4-(methylthio)-phenyl]-2-morpholino-1-propane, 3,3',4,4'-tetra(t-butylperoxycarbonyl)benzophenone, benzyl, benzoinisopropyl ether, benzoin-isobutyl ether, 4,4'-dimethoxybenzyl, 1,4-dibenzoylbenzene, 4-benzoylbiphenyl, 2-benzoylnaphthalene, methyl-o-benzoyl benzoate, 2,2'-bis(o-chlorophenyl)-4,4',5,5'-tetraphenyl-1,2'-biimidazole, 10-butyl-2-chloroacridone, ethyl-4-dimethylamino benzoate, dibenzoylmethane, 2,4-diethylthioxanthone, 3,3-dimethyl-4-methoxybenzophenone, 2-hydroxy-2-methyl-1-phenylpropane-1-one, 1-(4-isopropylphenyl)-2-hydroxy-2-methylpropane-1-one, 1-(4-dodecylphenyl)-2-hydroxy-2-methylpropane-1-one, 1-phenyl-1,2-butanedione-2-(o-methoxycarbonyl)oxime, 1-phenylpropanedione-2-(o-benzoyl)oxime, 1,2-diphenylethanedione -1-(o-benzoyl)oxime, 1,3-diphenylpropanetrione -2-(o-benzoyl)oxime, 1-phenyl-3-ethoxypropanetrione -2-(o-benzoyl)oxime, glycine compounds, and oxazolone compounds. The present invention is not limited to use of these exemplified compounds. These may be used alone or in combination of two or more.

Furthermore, the sensitizer used in the present invention is preferably a compound having an absorption maximum wavelength (λmax) in 330-500 nm. If λ max is less than 330 nm, light is absorbed into polyamic acid per se and photo-reaction does not take place. On the other hand, if it is more than 500 nm, photo-reaction takes place with visible light and so working room must be a shielded room and thus, handleability is lowered. Nonlimiting examples of such sensitizers preferably used in the present invention are as follows:

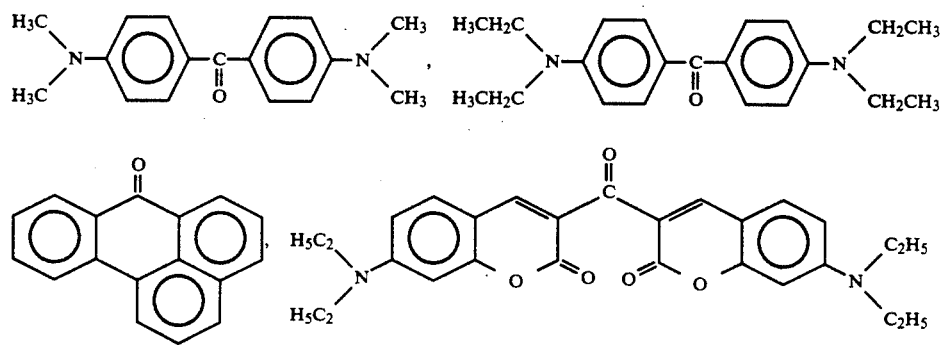

-continued
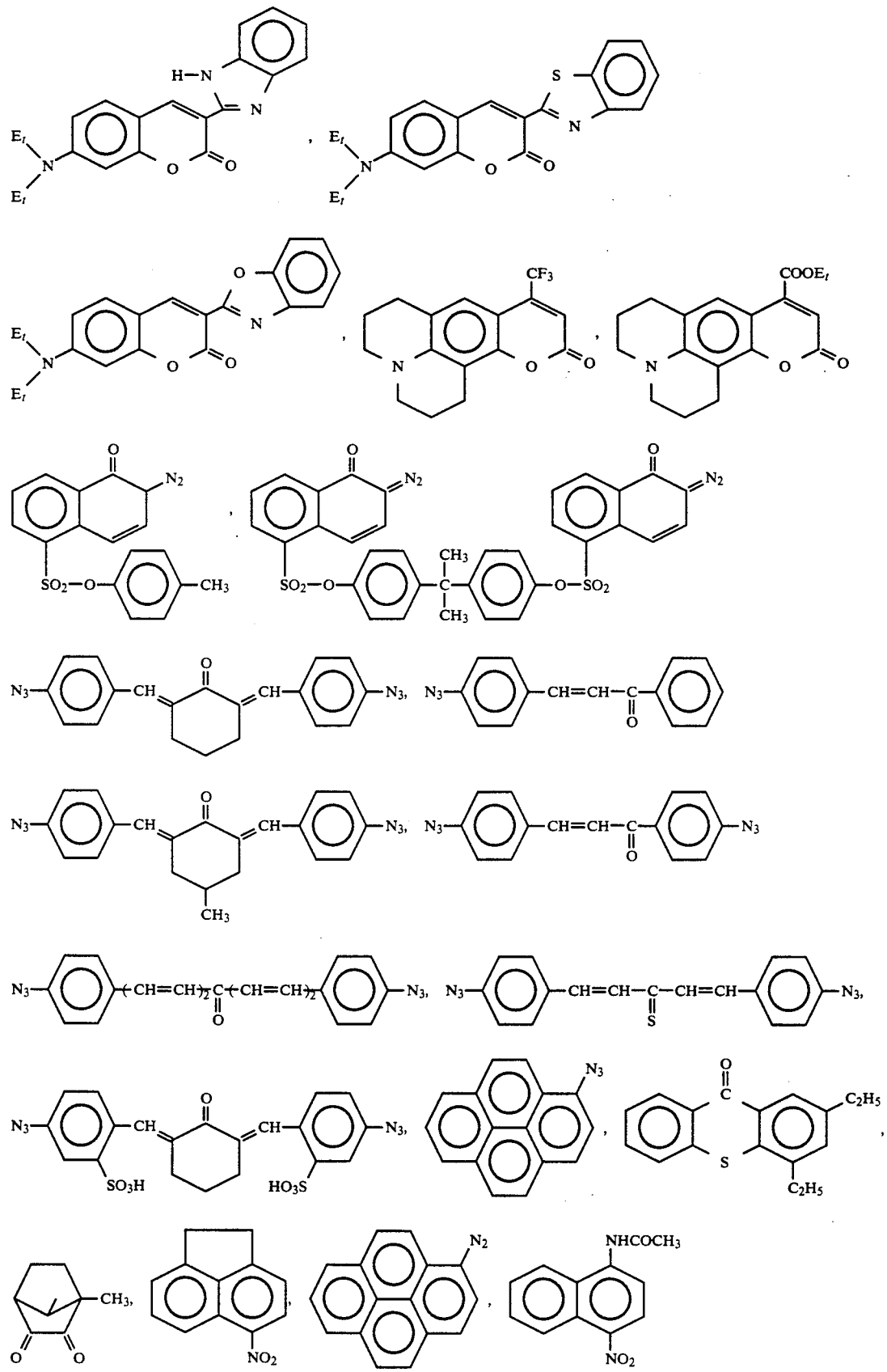

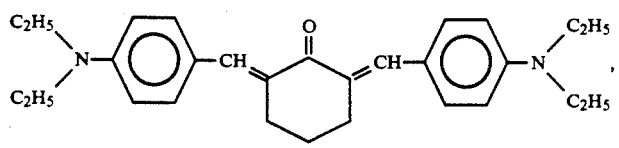
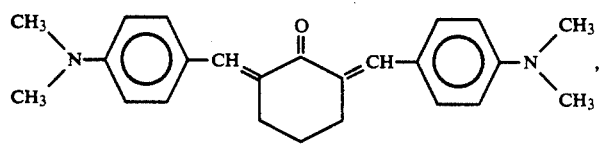
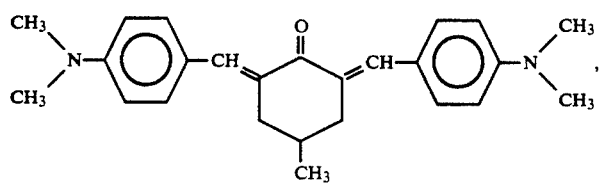
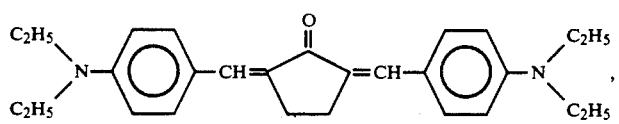
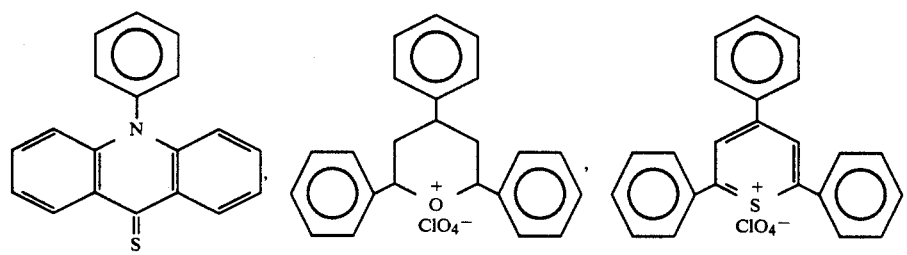
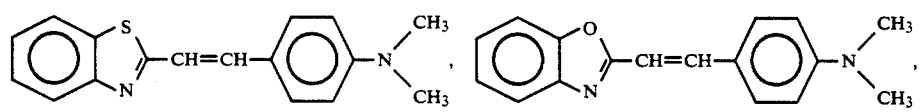
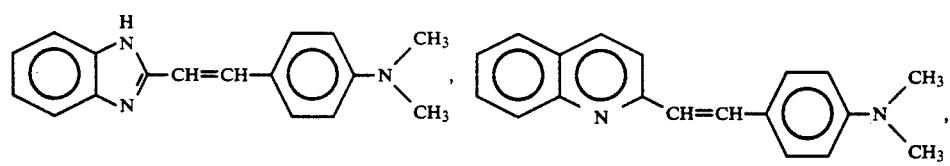
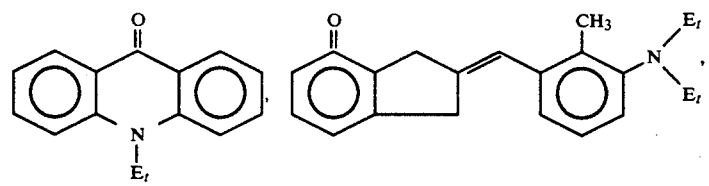
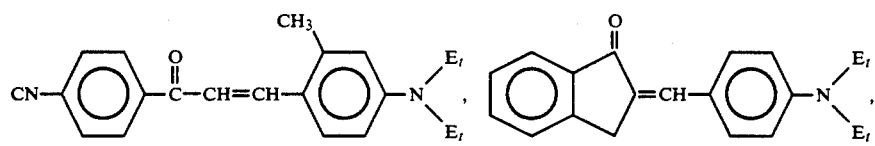

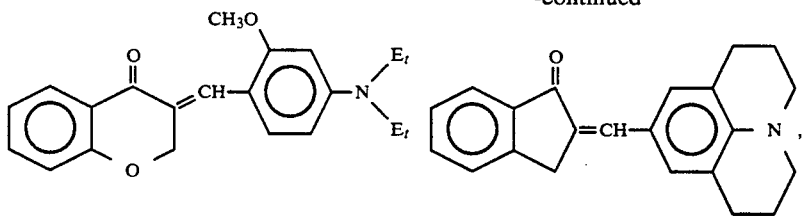

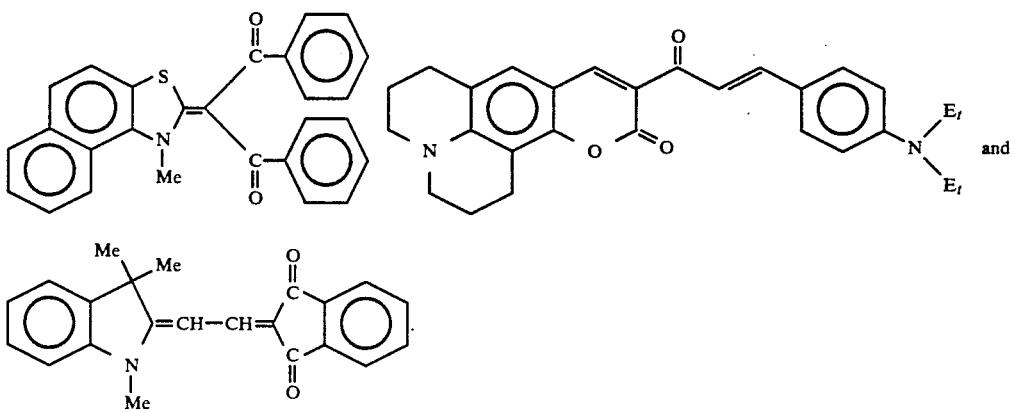

These sensitizers may be used alone or in combination of two or more.

When a styryl compound represented by the following formula [VIII] is used as a sensitizer component, sensitivity is enhanced and use of it is preferred.

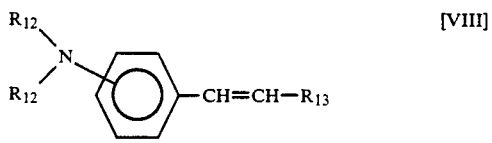
[VIII]

wherein $R_{12}$ means —H, —$CH_3$, —$C_2H_5$ or —$C_6H_5$, and $R_{13}$ means

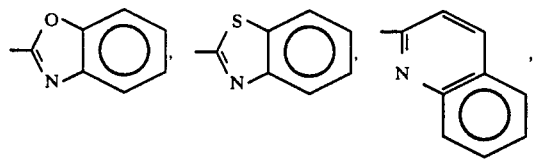

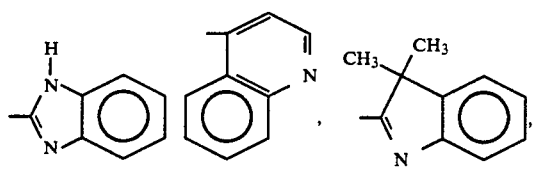

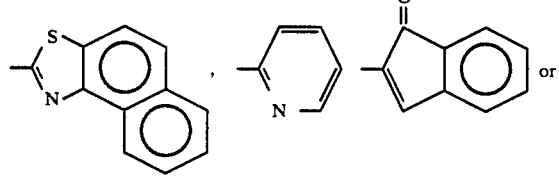

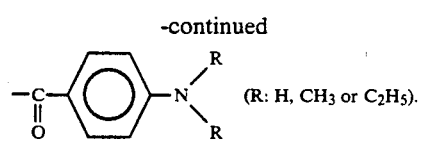
(R: H, $CH_3$ or $C_2H_5$).

Furthermore, sensitivity is further enhanced when a glycine compound represented by the following formula [IX] is used as a sensitizer component. It is especially preferred to use this glycine compound in combination with the above-mentioned compound having an absorption maximum wavelength in 330–500 nm or the above-mentioned styryl compound.

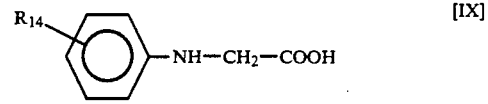
[IX]

wherein $R_{14}$ means —H, —$CH_3$, —$C_2H_5$, —$C_6H_5$, —$OCH_3$, —$OCOCH_3$, —$OC_2H_5$, —$OCOC_2H_5$, —$N(CH_3)_2$, —$N(C_2H_5)_2$, —$NHCOOCH_3$, —$COCH_3$, —$COC_2H_5$, —$NHCONH_2$, —$CH_{20}H$, —OH, —$CH(CH_3)_2$, or —$C(CH_3)_3$.

Adhesive aid, leveling agent and other various additives may be added to the photosensitive resin composition of the present invention.

The photosensitive resin composition of the present invention can be used in the following manner: that is, the composition is first coated on a suitable support such as silicon wafer, ceramic substrate or aluminum substrate. Coating is carried out by spin coating with a spinner, spray coating with a spray coater, dip coating, printing, roll coating or the like. Then, the coated film is pre-baked at a temperature of 60°–80° C. to dry it. Thereafter, the coated film is irradiated with actinic ray in the form of the desired pattern. As actinic ray, X-ray, electronic ray, ultraviolet ray, visible ray and the like may be used, but preferred are those which have a wavelength of 200–500 nm.

Then, unirradiated portion is dissolved away with a developing solution to obtain a relief pattern. As the developing solution, there may be used N-methyl-2-pyrrolidone, N,N-dimethylacetamide, N,N-dimethylformamide, methanol, isopropyl alcohol, water or the like alone or in admixture of them. Development can be carried out by spray, paddle, dip or ultrasonic development.

Then, the relief pattern formed by development is rinsed. As the rinsing solution, there may be used methanol, ethanol, isopropyl alcohol, butyl acetate or the like. Then, the relief pattern is subjected to heat treatment to form an imide ring to obtain a final pattern high in heat resistance.

The photosensitive resin composition of the present invention is useful not only for a semiconductor, but also as layer insulation film of multilayer circuit board, cover coat of flexible copper-clad sheet, solder resist film, liquid crystal oriented film, and the like.

In the field of a photosensitive polyamic acid, according to the conventional technique, a photosensitive group was introduced into a polyamic acid using ester bond to obtain photo-crosslinked structure. However, not only cost for production is high due to complicated production steps of this process, but also properties of the cured film are inferior, and this process is not suitable for semiconductor industry.

According to a process of incorporating a photosensitive agent having amino group into a polyamic acid, developing and patterning are performed by quasicrosslinking caused by interaction of amino group and carboxyl group of the polyamic acid, and hence sensitivity is low even upon irradiation with light and in addition, cracks occur in the pattern at development or amount of the film much decreases and thus, this process is not suitable either for semiconductor industry.

On the other hand, according to the present invention, a photosensitive resin composition can be obtained by an extremely easy process of incorporating an amide compound (B) having carbon-carbon double bond and a photosensitizer (C) into a polyamic acid (A). Therefore, not only production cost is low, but also the compound having carbon-carbon double bond easily dissolves into the polyamic acid owing to the amide group, and thus it has become possible to add the photosensitive agent homogeneously and in a high concentration.

Furthermore, by adding a photosensitizer component, there is obtained a photosensitive resin composition capable of readily providing a pattern of high sensitivity and high resolution. Moreover, this photosensitive resin composition is obtained by mere addition of the photosensitive agent and not by introducing a photosensitive group into the polyamic acid through direct covalent bond. Therefore, advantageous effects of easy scattering of the photosensitive agent with heat at curing and superior properties of the resulting cured film can be simultaneously obtained.

There occur no problems even when additives other than the essential components (A), (B) and (C) are incorporated in the present composition for imparting various characteristics.

The present invention will be explained in more detail by the following examples.

EXAMPLE 1

290 g (0.9 mol) of 3,3', 4,4'-benzophenonetetracarboxylic acid dianhydride and 200 g (1.0 mol) of 4,4'-diaminodiphenyl ether were introduced into 2510 g of N-methyl-2-pyrrolidone, and reaction was allowed to proceed for 6 hours at 20° C. The resulting polyamic acid had a number-average molecular weight of 18,000 according to GPC.

To 612 parts by weight (100 parts by weight in terms of solid content) of the resulting polyamic acid solution, there were added 50 parts by weight of methacrylamide and 5 parts by weight of Michler's ketone (λ max: 365 nm) to dissolve them at room temperature. The resulting composition was coated on a silicon wafer by a spinner and dried at 80° C. for 1 hour by an oven to obtain a film.

On this film was superposed a photographic stem tablet No. 2 (21 steps) manufactured by Kodak Co. (in this gray scale, with increase by one step in the number of steps, quantity of transmission light decreases to $1/\sqrt{2}$ of that of the preceding step, and hence sensitivity is higher with increase in the number of steps where patterns remain after development), and then the film was irradiated with ultraviolet ray of 1000 mj/cm$^2$ and subsequently developed with a developing solution comprising 60 parts by weight of N-methyl-2-pyrrolidone and 40 parts by weight of methanol and furthermore rinsed with isopropyl alcohol. Patterns of up to eight steps remained and thus it was found that the film had high sensitivity.

Separately, in the same manner as above, a pattern was formed using a mask for measuring resolution manufactured by Toppan Printing Co., Ltd. (Toppan Test Chart No. 1). The pattern was resolved up to 4 μm and this indicates high resolution.

Separately, the composition was coated on an aluminum sheet and the whole surface was exposed and subjected to the steps of development and rinsing and then heat-cured at 150° C., 250° C., and 350° C. for 30 minutes, respectively. Then, the aluminum sheet was removed by etching to obtain a film.

The film had a high tensile strength (measured according to JIS K-6760) of 14 kg/mm$^2$ (the higher the better) and a high heat-decomposition starting temperature (TGA) of 400° C. (the higher the better).

Thus, it can be seen that the photosensitive resin composition of the present invention can be obtained by very easy process and is high in sensitivity and resolution and excellent in properties of the film formed by curing.

EXAMPLE 2

A resin was obtained in the same manner as in Example 1 except that pyromellitic acid dianhydride was used in place of 3,3',4,4'-benzophenonetetracarboxylic acid dianhydride, and evaluation of the resin was conducted as in Example 1.

The step number of the step tablet was seven and resolution was 4 μm, which means high sensitivity and high resolution. Furthermore, the resulting film had a high tensile strength of 14 kg/mm$^2$ and a high heat-decomposition starting temperature of 415° C. and besides, properties of the film after cured were superior.

EXAMPLE 3

To 100 parts by weight of the polyamic acid solution (solid content of polyamic acid) obtained in Example 1, there were added 80 parts by weight of N-methylolacrylamide and 5 parts by weight of Michler's ketone, followed by stirring for 3 hours at room temperature to dissolve them and to allow reaction to proceed.

The resulting solution was coated on an aluminum sheet by a spinner and dried at 70° C. for 1 hour by an oven to obtain a film.

On this film was superposed a photographic step tablet No. 2 (21 steps) manufactured by Kodak Co., and the film was irradiated with ultraviolet ray of 1000 mj/cm² and subsequently developed with a developing solution comprising 60 parts by weight of N-methyl-2-pyrrolidone and 40 parts by weight of xylene and furthermore rinsed with xylene. Patterns of up to eleven steps remained and this means high sensitivity.

Separately, in the same manner as above, a pattern was formed using a mask for measuring resolution manufactured by Toppan Printing Co., Ltd. (Toppan Test Chart No. 1). The pattern was resolved up to 3 μm and this indicates high resolution.

Separately, the composition was coated on an aluminum sheet and the whole surface was exposed and subjected to the steps of development and rinsing and then heat-cured at 150° C., 250° C., and 350° C. for 30 minutes, respectively. Then, the aluminum sheet was removed by etching to obtain a film.

The film had a high tensile strength (measured according to JIS K-6760) of 9 kg/mm² (the higher the better) and a high heat-decomposition starting temperature (TGA) of 380° C. (the higher the better).

EXAMPLE 4

A photosensitive resin composition was obtained in the same manner as in Example 3 except that N-methoxymethylacrylamide was used in place of N-methylolacrylamide in Example 3, and evaluation was conducted as in Example 3.

The step number of the step tablet was ten and resolution was 3 μm. Tensile strength was 8 kg/mm² and heat-decomposition starting temperature was 385° C. Thus, excellent properties were obtained simultaneously.

EXAMPLE 5

Example 3 was repeated except that 50 parts by weight of dimethacrylamide having the following formula was used in place of N-methylolacrylamide, and evaluation was conducted as in Example 3.

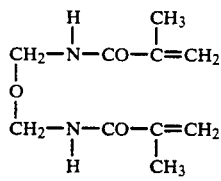

Sensitivity was ten steps, resolution was 5 μm, tensile strength was 10 kg/mm², and heat-decomposition starting temperature was 385° C. These were all superior. Thus, the effects of high sensitivity, high resolution, and excellent properties of the cured film were simultaneously obtained by extremely easy process.

EXAMPLE 6

To 100 parts by weight of the polyamic acid solution (solid content of polyamic acid) obtained in Example 1, there were added 120 parts by weight of an ether type condensate of N-methylolacrylamide and ethylene glycol and 5 parts by weight of Michler's ketone, followed by stirring for 3 hours at room temperature to dissolve and react them. Thereafter, evaluation was conducted in the similar manner. As a result, the number of steps of the step tablet was 10 which means high sensitivity, resolution was 5 μm, tensile strength was 9 kg/mm² and heat-decomposition starting temperature was 380° C. Thus, excellent effects were obtained simultaneously.

EXAMPLE 7

A photosensitive resin composition was obtained in the same manner as in Example 6 except that an ether type condensate of N-methylolacrylamide and polyvinyl alcohol was used in place of the ether type condensate of N-methylolacrylamide and ethylene glycol used in Example 6. Evaluation was conducted in the same manner as in Example 1. As a result, the number of steps of the step tablet was 12 which means high sensitivity, resolution was 5 μm, tensile strength was 8 kg/mm², and heat-decomposition starting temperature was 370° C. Thus, excellent effects were obtained simultaneously.

EXAMPLE 8

290 g (0.9 mol) of 3,3',4,4'-benzophenonetetracarboxylic acid dianhydride and 200 g (1.0 mol) of 4,4'-diaminodiphenyl ether were introduced into 2510 g of N,N-dimethylacrylamide, and reaction was allowed to proceed for 6 hours at 20° C.

To 612 parts by weight of the resulting polyamic acid solution (100 parts by weight in terms of solid content) were added 5 parts by weight of Michler's ketone (λ max: 365 nm) to dissolve it at room temperature. The resulting composition was coated on a silicon wafer by a spinner and dried at 60° C. for 1 hour by an oven to obtain a film.

Evaluation was conducted in the same manner as in Example 1. As a result, the number of steps of the step tablet was 10 which means high sensitivity, resolution was 3 μm, tensile strength was 15 kg/mm², and heat-decomposition starting temperature was 415° C. Thus, excellent effects were obtained simultaneously.

EXAMPLE 9

A photosensitive resin composition was obtained in the same manner as in Example 8 except that N-acryloylmorpholine was used in place of N,N-dimethylacrylamide, and evaluation was conducted as in Example 8. As a result, the number of steps of the step tablet was 9 which indicates high sensitivity, resolution was 4 μm, tensile strength was 14 kg/mm², and heat-decomposition starting temperature was 405° C. Thus, excellent effects were obtained simultaneously.

EXAMPLE 10

The polyamic acid solution obtained in Example 1 was added dropwise to 100 liters of methyl alcohol under vigorous stirring to precipitate the polyamic acid and the precipitate was filtrated. To a polyamic acid solution of 100 g of the resulting solid reaction product dissolved in 525 g of N,N-dimethylacrylamide was added 5 g of Michler's ketone (λ max: 365 nm) and the Michler's ketone was dissolved at room temperature.

The resulting composition was evaluated in the same manner as in Example 8. As a result, the number of steps of the step tablet was 9 which indicates high sensitivity, resolution was 3 μm, tensile strength was 13 kg/mm², and heat-decomposition starting temperature was 420° C. Thus, excellent effects were simultaneously obtained.

EXAMPLE 11

322 g (1.0 mol) of 3,3',4,4'-benzophenonetetracarboxylic acid dianhydride and 11.4 g (0.05 mol) of glycerol dimethacrylate were introduced into 2890 g of N-methyl-2-pyrrolidone, and reaction was allowed to proceed at 50° C. for 16 hours. Then, 200 g (1.0 mol) of 4,4'-diaminodiphenyl ether was introduced thereinto, and reaction was allowed to proceed at 20° C. for 6 hours.

To 612 parts by weight (100 parts by weight in terms of solid content) of the resulting polyamic acid solution, there were added 50 parts by weight of methacrylamide and 5 parts by weight of Michler's ketone (λ max: 365 nm), and they were dissolved at room temperature.

Then, the same evaluation as in Example 1 was conducted. As a result, the number of steps of the step tablet was 10 which means high sensitivity, resolution was 3 μm, tensile strength was 10 kg/mm$^2$, and heat-decomposition starting temperature was 395° C. Thus, excellent effects were obtained at the same time.

EXAMPLE 12

322 g (1.0 mol) of 3,3',4,4'-benzophenonetetracarboxylic acid dianhydride and 11.4 g (0.05 mol) of glycerol dimethacrylate were introduced into 2890 g of N,N-dimethylacrylamide, and reaction was allowed to proceed at 50° C. for 16 hours. Then, 200 g (1.0 mol) of 4,4'-diaminodiphenyl ether was introduced thereinto and reaction was allowed to proceed at 20° C. for 6 hours.

To 612 g (100 g in terms of solid content) of the resulting polyamic acid solution was added 5 g of Michler's ketone (λ max: 365 nm), and this was dissolved at room temperature. The resulting composition was coated on a silicon wafer by a spinner and dried at 50° C. for 1 hour by a dryer to obtain a film.

Then, the same evaluation as in Example 1 was conducted. As a result, the number of steps of the step tablet was 12 which means high sensitivity, resolution was 4 μm, tensile strength was 9 kg/mm$^2$, and heat-decomposition starting temperature was 390° C. Thus, excellent effects were obtained at the same time.

EXAMPLE 13

A photosensitive resin composition was obtained in the same manner as in Example 12 except that 2-hydroxyethyl methacrylate was used in place of glycerol dimethacrylate, and evaluation was conducted as in Example 12. As a result, the number of steps of the step tablet was 12 which indicates high sensitivity, resolution was 3 μm, tensile strength was 8 kg/mm$^2$, and heat-decomposition starting temperature was 390° C. Thus, excellent effects were obtained simultaneously.

EXAMPLE 14

A photosensitive resin composition was obtained in the same manner as in Example 1 except that 4 g (4 parts by weight) of 2-(p-dimethylaminostyryl)benzoxazole and 8 g (8 parts by weight) of N-phenylglycine were used in place of Michler's ketone.

The resulting composition was evaluated in the same manner as in Example 1. As a result, the number of steps of the step tablet was 10 which indicates high sensitivity, resolution was 5 μm, tensile strength was 14 kg/mm$^2$, and heat-decomposition starting temperature was 405° C. Thus, excellent effects were simultaneously obtained.

EXAMPLE 15

A photosensitive resin composition was obtained in the same manner as in Example 12 except that 4 g (4 parts by weight) of 2-(p-dimethylaminostyryl)benzoxazole and 8 g (8 parts by weight) of N-phenylglycine were used in place of Michler's ketone and that 12 g (12 parts by weight) of N,N-dimethylaminoethyl methacrylate was further added.

The resulting composition was evaluated in the same manner as in Example 12. As a result, the number of steps of the step tablet was 15 which indicates high sensitivity, resolution was 5 μm, tensile strength was 9 kg/mm$^2$, and heat-decomposition starting temperature was 405° C. Thus, excellent effects were simultaneously obtained.

EXAMPLE 16

The composition obtained in Example 1 was spin-coated by a spinner on a silicon wafer, on which a semiconductor element circuit of ultra LSI (1 M bit) had been formed, and dried at 80° C. for 1 hour in a dryer to form a polyimide film of 10 μm thickness on the whole surface of the wafer.

Then, the film was exposed and developed and the film on bonding pat portion was removed. Then, the wafer was heat-treated at 150° C., 250° C. and 350° C. for 30 minutes, respectively and the heat-treated wafer was scribed and cut into chips of 6×12 mm square. These semiconductor elements were mounted on 4.2 Alloy and bonded by gold wire and thereafter, sealed with an epoxy molding compound. The resulting semiconductor device showed no failure for more than 2000 hours in a high temperature, high humidity, high bias test (85° C., 85%RH, application of 10V) and a pressure cooker test (125° C., 2.3 atm), and besides there occurred no error operation by α-ray.

Similarly, good semiconductor devices were obtained using the compositions obtained in Examples 2, 3, 6, 8, and 12.

COMPARATIVE EXAMPLE 1

A resin composition was obtained in the same manner as in Example 1 except that methyl methacrylate was used in place of methacrylamide, and subjected to the same evaluation as in Example 1. The photosensitive agent had no amide group and so was inferior in compatibility with the polyamic acid and no pattern could be formed.

COMPARATIVE EXAMPLE 2

A photosensitive resin composition was obtained in the same manner as in Example 1 except that diethylene glycol dimethacrylate was used in place of methacrylamide, and the same evaluation was carried out.

The photosensitive agent had no amide group and so was inferior in compatibility with the polyamic acid and no pattern could be formed.

COMPARATIVE EXAMPLE 3

Blending of components was carried out in the same manner as in Example 8 except that N-methyl-2-pyrrolidone was used in place of N,N-dimethylacrylamide. The composition showed no photo-responsiveness. Therefore, 60 parts by weight of dimethylaminoethyl methacrylate was further added as a compound having carbon-carbon double bond and amino group and capable of being dimerized or polymerized by actinic ray.

Coating of the composition and evaluation of the film were carried out in the same manner as in Example 8. The number of steps of the step tablet was only 5 which means low sensitivity. Furthermore, when change of viscosity at room temperature (23° C.) was measured, viscosity decreased by 20% after 3 days.

COMPARATIVE EXAMPLE 4

A photosensitive resin composition was obtained in the same manner as in Example 1 except that Michler's ketone was not used, and evaluation was carried out as in Example 1. Photo-reaction did not efficiently proceed, and all of the patterns flowed away at development, and thus this composition could not be practically used.

COMPARATIVE EXAMPLE 5

290 g of 3,3',4,4'-benzophenonetetracarboxylic acid dianhydride and 244 g of 2-hydroxyethyl methacrylate were dissolved in Y-butyrolactone, and then 150 g of pyridine was added thereto as a catalyst and reaction was allowed to proceed at 20° C. for 24 hours to obtain an esterification product. Then, thereto were added dicyclohexylcarbodiimide as an amidation catalyst and thereafter, 200 g of 4,4'-diaminodiphenyl ether, and reaction was allowed to proceed at 20° C. for 8 hours. Then, the resulting slurry was filtrated and the filtrate was added dropwise to 350 liters of ethanol with vigorous stirring to precipitate a polymer, followed by leaving at rest for 12 hours. The precipitate was collected by filtration, dried and ground. The resulting polymer had a molecular weight of 6500, which was considerably lower than expected. Therefore, a polymer was again prepared by the same process as above, but the resulting polymer also had a molecular weight of as low as 11000. It was found that this process was complicated in steps and required a long time and besides gave scattering results.

Then, this polymer was dissolved in N-methyl-2-pyrrolidone, and thereto was added the same sensitizer as used in example 1 to obtain a photosensitive resin composition, and evaluation was carried out as in Example 1. The number of steps of the step tablet was 8. However, tensile strength was 2.0 kg/mm² and heat-decomposition starting temperature was 335° C., which were inferior.

We claim:

1. A photosensitive resin composition which comprises, as essential components:
   (A) a polyamic acid having a recurring unit represented by the following formula [I]:

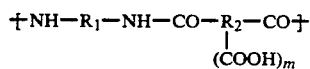

wherein $R_1$ and $R_2$ each represents an organic group selected from the group consisting of an aromatic group, an alicyclic group, an aliphatic group, and a heterocyclic group, and m is 1 or 2,
   (B) an amide or amine compound having a carbon-carbon double bond selected from the group consisting of:

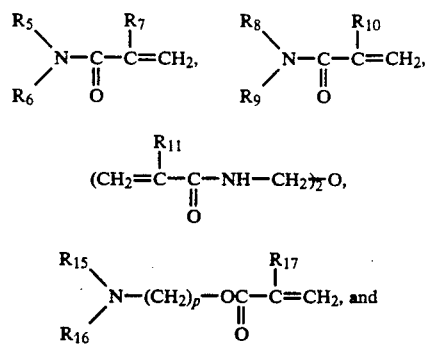

a condensate of an N-methylolacrylamide or methacrylamide and a polyhydric alcohol, wherein $R_5$ and $R_6$ each represents H, $CH_6$ or $C_2H_5$ and $R_7$ represents H or $CH_9R_6$ represents H, $CH_9$, $C_2H_5$, $CH_2OH$, or $CH_2OCH_8$, $R_9$ represents —$CH_2OH$, —$CH_2OCH_3$, —$CH_2OC_2H_5$, —$CH_2OC_3H_7$, or —$CH_2OC_4H_9$, or

represents a morpholino, $R_{10}$ represents H or $CH_3$, $R_{11}$ represents H or $CH_3$, $R_{15}$ and $R_{16}$ each represents $CH_9$, or $C_2H_5$, $R_{17}$ represents H or $CH_3$ and p is 2 or 3, and (C) a photosensitizer.

2. A photosensitive resin composition according to claim 1, wherein the polyamic acid (A) is represented by the following formula [II]:

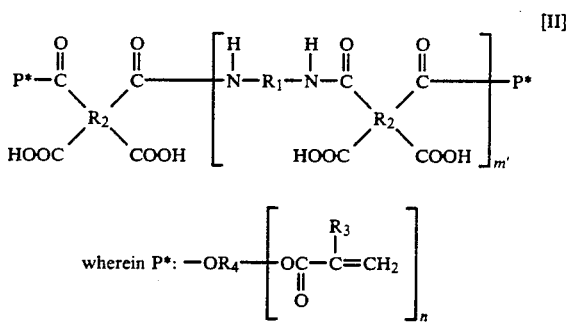

wherein n=1–5, $R_3$ represents H or $CH_3$, $R_4$ represents an organic residue, m' is an integer of 10–10000, and $R_1$ and $R_2$ each represents an organic group selected from the group consisting of an aromatic group, an alicyclic group, an aliphatic group and a heterocyclic group.

3. A photosensitive resin composition according to claim 2, wherein the end group P* is a 2-hydroxyethyl methacrylate or acrylate derivative represented by the following formula [III]:

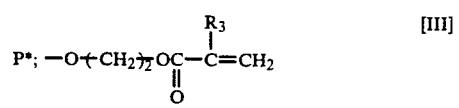

wherein $R_3$ represents H or $CH_3$.

4. A photosensitive resin composition according to claim 2, wherein the end group P* is a glycerol dimethacrylate or diacrylate derivative represented by the following formula [IV]:

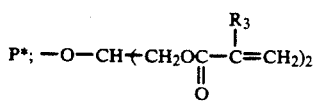

wherein $R_3$ represents H or $CH_3$.

5. A photosensitive resin composition according to claim 1, wherein the polyamic acid (A) is prepared from pyromellitic acid dianhydride or 3,3',4,4'-benzophenonetetracarboxylic acid dianhydride and 4,4'-diaminodiphenyl ether as main components.

6. A photosensitive resin composition according to claim 1, wherein the amide compound (B) having carbon-carbon double bond is liquid at room temperature.

7. A photosensitive resin composition according to claim 6, wherein the polyamic acid (A) is obtained by reaction in the amide compound having carbon-carbon double bond which is liquid at room temperature.

8. A photosensitive resin composition according to claim 1, wherein the amide compound (B) having carbon-carbon double bond is acrylamide or methacrylamide.

9. A photosensitive resin composition according to claim 1, wherein the amide compound (B) having carbon-carbon double bond is a dialkylacrylamide compound or a dialkylmethacrylamide compound represented by the following formula [V]:

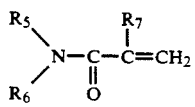

wherein $R_5$ and $R_6$ each represents $CH_3$ or $C_2H_5$ and $R_7$ represents H or $CH_3$.

10. A photosensitive resin composition according to claim 1, wherein the amide compound (B) having carbon-carbon double bond is N-acryloylmorpholine.

11. A photosensitive resin composition according to claim 1, wherein the amide compound (B) having carbon-carbon double bond is an N-methylolacrylamide or methacrylamide derivative or an N-alkoxymethylacrylamide or methacrylamide derivative represented by the following formula [VI]:

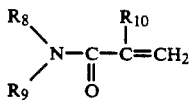

wherein $R_8$ represents H, $CH_3$, $C_2H_5$, $CH_2OH$, or $CH_2OCH_3$, $R_9$ represents $-CH_2OH$, $-CH_2OCH_3$, $-CH_2OC_2H_5$, $-CH_2OC_3H_7$, or $-CH_2OC_4H_9$ and $R_{10}$ represents H or $CH_3$.

12. A photosensitive resin composition according to claim 1, wherein the amide compound (B) having carbon-carbon double bond is a diacrylamide or dimethacrylamide compound represented by the following formula [VII]:

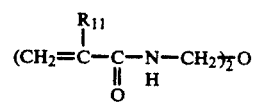

wherein $R_{11}$ represents H or $CH_3$.

13. A photosensitive resin composition according to claim 1, wherein the amide compound (B) having carbon-carbon double bond is a condensate of an N-methylolacrylamide or methacrylamide and a polyhydric alcohol.

14. A photosensitive resin composition according to claim 1, wherein the photosensitizer (C) has an absorption maximum wavelength λ max of 330-500 nm.

15. A photosensitive resin composition according to claim 1, wherein the photosensitizer (C) is a glycine compound represented by the following formula [IX]:

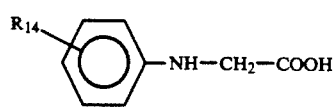

wherein $R_{14}$ represents $-H$, $-CH_3$, $-C_2H_5$, $-C_6H_5$, $-OCH_3$, $-OCOCH_3$, $-OC_2H_5$, $-OCOC_2H_5$, $-N(CH_3)_2$, $-N(C_2H_5)_2$, $-NHCOOCH_3$, $-COCH_3$, $-COC_2H_5$, $-NHCONH_2$, $-CH_2OH$, $-OH$, $-CH(CH_{32})_2$, or $-C(CH_3)_3$.

16. A photosensitive resin composition according to claim 1, which contains a dialkylaminoacrylate or methacrylate compound represented by the formula [X]:

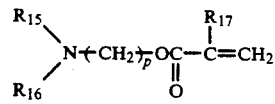

wherein $R_{15}$ and $R_{16}$ each represents $CH_3$, or $C_2H_5$, $R_{17}$ represents H or $CH_3$ and p is 2 or 3.

17. A photosensitive resin composition according to claim 1, wherein the photosensitizer (C) is a styryl compound represented by the following formula [VIII]:

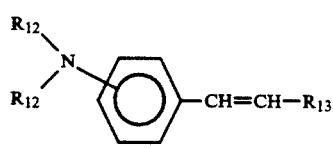

wherein $R_{12}$ represents $-H$, $-CH_3$, $-C_2H_5$, or $-C_6H_5$, and $R_{13}$ represents:

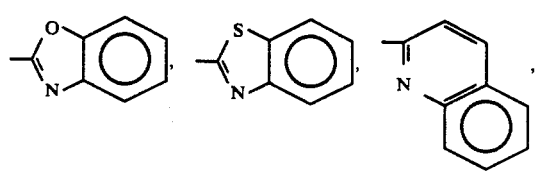

-continued
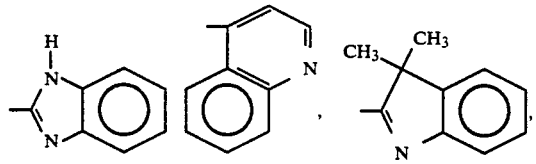
-continued
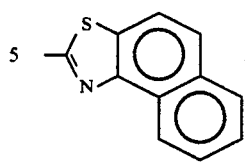, 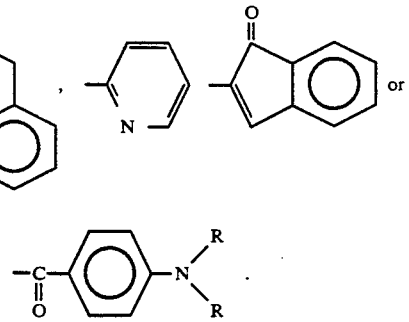
wherein R represents H, CH₃ or C₂H₅.
* * * * *